United States Patent

Wu

[11] Patent Number: 6,153,467
[45] Date of Patent: Nov. 28, 2000

[54] METHOD OF FABRICATING HIGH DENSITY BURIED BIT LINE FLASH EEPROM MEMORY CELL WITH A SHALLOW TRENCH FLOATING GATE

[75] Inventor: Shye-Lin Wu, Hsinchu, Taiwan

[73] Assignee: Texas Instruments - Acer Incorporated, Hsinchu, Taiwan

[21] Appl. No.: 09/271,736

[22] Filed: Mar. 18, 1999

Related U.S. Application Data

[63] Continuation-in-part of application No. 09/089,897, Jun. 3, 1998, Pat. No. 6,048,765.

[51] Int. Cl.[7] .................................................. H01L 21/336
[52] U.S. Cl. .................... 438/257; 438/221; 438/222; 438/259; 438/262; 438/270; 438/280; 438/263
[58] Field of Search ..................................... 438/257, 221, 438/222, 259, 262, 26, 270, 280, 263

[56] References Cited

U.S. PATENT DOCUMENTS

| | | |
|---|---|---|
| 4,981,812 | 1/1991 | Nishizaka . |
| 5,208,179 | 5/1993 | Okazawa . |
| 5,340,769 | 8/1994 | Miyamoto . |
| 5,744,847 | 4/1998 | Wen . |
| 5,872,043 | 2/1999 | Chen . |
| 5,880,007 | 3/1999 | Varian et al. . |
| 5,970,341 | 10/1999 | Lin et al. . |
| 6,008,079 | 12/1999 | Wu . |
| 6,048,765 | 4/2000 | Wu . |
| 6,084,264 | 7/2000 | Wu . |

*Primary Examiner*—John F. Niebling
*Assistant Examiner*—Jonathan Hack
*Attorney, Agent, or Firm*—Harness, Dickey & Pierce, P.L.C.

[57] ABSTRACT

A method of fabricating buried bit line flash EEROM with shallow trench floating gate for suppressing the short channel effect is disclosed. The method comprises following steps. Firstly, a pad oxide layer and a conductive impurity (such as phosphorus) doped polysilicon layer is successively formed on the silicon substrate. Then, an oxidation process is performed to oxidize the polysilicon layer and to drive in the conductive impurities. After coating a patterned mask on the resultant surface to define a plurality of buried bit line regions, a dry etch is used to etch away the unmask regions till the silicon substrate is slightly recessed to form shallow trenches. Subsequently, the photoresist is stripped, and a gate dielectric layer, such as gate nitride or oxynitride layer is formed on the resultant surface. After refilling a plurality of trenches with a conductive impurity doped silicon layer, a planarization process such as CMP is followed to form a plain surface using the gate dielectric layer as an etching stopped layer. A stacked ONO layer is then deposited as an interpoly dielectric layer; and finally another a conductive impurity doped polysilicon layer is formed and patterned to be as word lines.

14 Claims, 6 Drawing Sheets

METHOD OF FABRICATING HIGH DENSITY BURIED BIT LINE FLASH EEPROM MEMORY CELL WITH A SHALLOW TRENCH FLOATING GATE

CROSS-REFERENCE TO RELATED APPLICATIONS

This is a continuation-in-part of U.S. patent application No. Ser. 09/089,897, filed Jun. 3, 1998 now U.S. Pat. No. 6,048,765.

The invention is a continuation-in-part of the application filed on Jun. 3, 1998, Ser. No. 09/089,897, under the same title assigned to the same assignee.

FIELD OF THE INVENTION

The present invention relates to a semiconductor memory process, and more specifically, to a structure of high-density buried bit line flash EEPROM memory cell with a shallow trench-floating gate.

BACKGROUND OF THE INVENTION

In recent years, the development of portable telecommunications and laptop computers has become a major driving force in the design and technology of semiconductor IC's. This growing market requires low power, high-density and electrically re-writable nonvolatile memories. Electrically erasable programmable read only memories (EEPROM) which are electrically erased on a byte-by-byte basis is one choice. However, the cell size of this type of memory is too large for such applications, and thus flash memory is another choice because of its small size and high reliability.

For achieving a high density memory device Kazerounian et al., introduced a virtual ground concept using alternative metal virtual ground (AMG) to fabricate EPROM in the paper, by R. Kazerounian et al. titled "Alternate Metal Virtual Ground EPROM Array Implemented in a 0.8 $\mu$m Process for Very High Density Applications", IEDM Tech. Dig., p. 311, 1991. The synoptic layout and cross-section of this memory array are shown in FIGS. 1a–b, The front end of the process is a standard n-well CMOS process. After LOCOS field oxidation and EPROM gate a layer of the polysilicon 10 is deposited, an ONO dielectric layer 15 is then formed on the top of polysilicon 10. The ONO 15/poly-Si 10 is then patterned in elongated strips across each segment. Subsequently, a self-aligned arsenic implant is applied to form bit lines 20. An oxidation process combined with the CMOS gate oxidation process is done to form a gate oxide and grow a bit line oxide. The process continues with doped polysilicon 25 and tungsten silicide 35 deposition. A self-aligned stack gate etch process is employed to define word line 25 and floating gate cell 40. The advantages of this array are reduction of drain turn-on induced punchthrough and the allowance of scaling of effective channel length to as low as 0.25 $\mu$m.

Later, the virtual ground concept then was applied to manufacture low voltage NOR virtual ground power flash memories by Bergemontet, et al. according to their flash memory with a fast access time. Their desing is set forth in the reference by A. Bergemont, et al., "Low voltage NVGTM: A New High Performance 3 V/5 V Flash Technology for portable Computing and Telecommunications Applications", IEEE Trans. Electron Devices, ED-43, p. 1510, 1996. The architecture of NVGTM is similar to AMG EPROM and features a one metal bit-line shared between two columns of cells. These metal bit-lines are strapped to every other diffusion bit-line (stripped, continuous bit lines) through the selected transistors.

SUMMARY OF THE INVENTION

There exists in the above-noted prior art some problems, such as the punch-through issue or a narrow space between the adjacent bit lines and short channel effect. Thus in the present invention, a method of fabricating a buried bit line flash EEROM using a recessed silicon trench floating gate for suppressing the short channel effect is disclosed. The method comprises following steps. Firstly, an ultra-thin pad oxide layer about 2–20 nm in thickness and a conductive impurity, such as phosphorus with concentrations of about $5 \times 10^{19}$–$5 \times 10^{21}$/cm$^3$, doped polysilicon layer is successively formed on the silicon substrate. Then, a high temperature oxidation process is performed to oxidize the polysilicon layer so as to form an oxide layer and to drive the conductive impurities through the pad oxide layer into the silicon layer. After coating a patterned mask on the oxide layer to define a plurality of buried bit line regions, a dry etch is used to etch the unmask regions until the silicon substrate is slightly recessed to form shallow trenches of about 50–600 nm in depth. Subsequently, the photoresist is stripped, and a gate dielectric layer formed of a gate nitride or oxynitride of about 3–25 nm in thickness is formed on the resultant surfaces. In the meantime, the buried bit line also formed where the bit line is a conductive layer beneath the remnant pad oxide layer. After refilling a plurality of trenches with a conductive impurity doped silicon layer, a planarization process such as CMP is done to form a plain surface using the gate dielectric layer as an etching stopped layer. A stacked ONO layer of about 5–30 nm is then deposited as an interpoly dielectric layer. Finally another n+ doped polysilicon layer is formed and patterned to act as word lines.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method of fabricating high density buried bit line flash EEROM with a floating gate in a trench of silicon substrate to prevent the short-channel effect is disclosed. The detailed processes are best illustrated by reference to the drawings, and are described as follows.

Figure 1A:
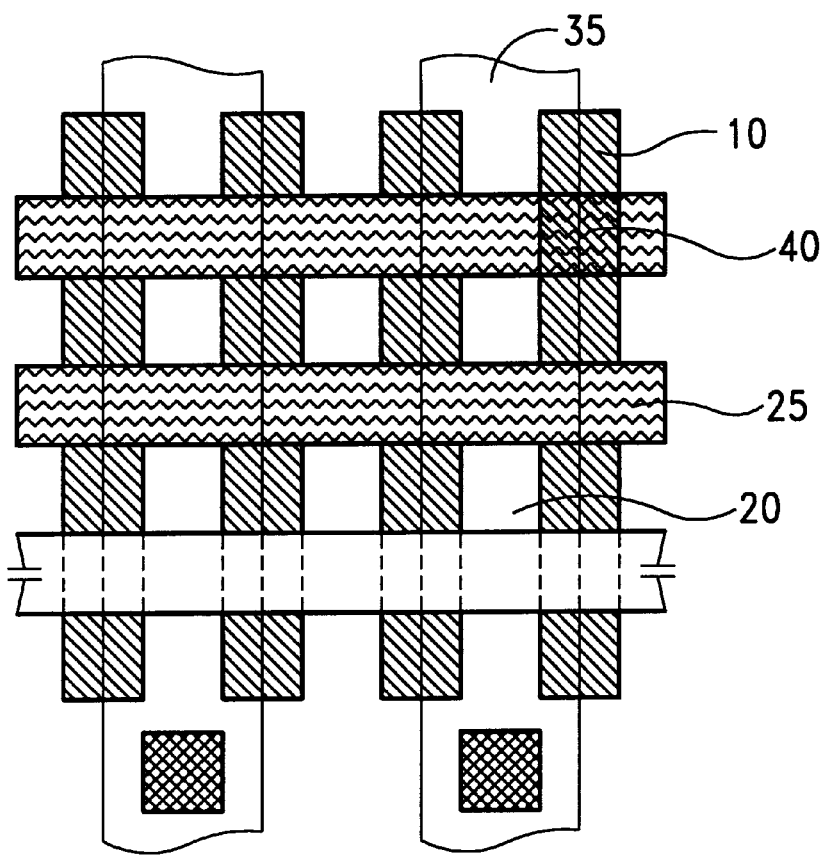
FIG. 1. is a synoptic layout of an EPROM array (FIG. 1a), and (FIG. 1b) is a cross-sectional view of an EPROM array, in accordance with the prior art.
Figure 1B:
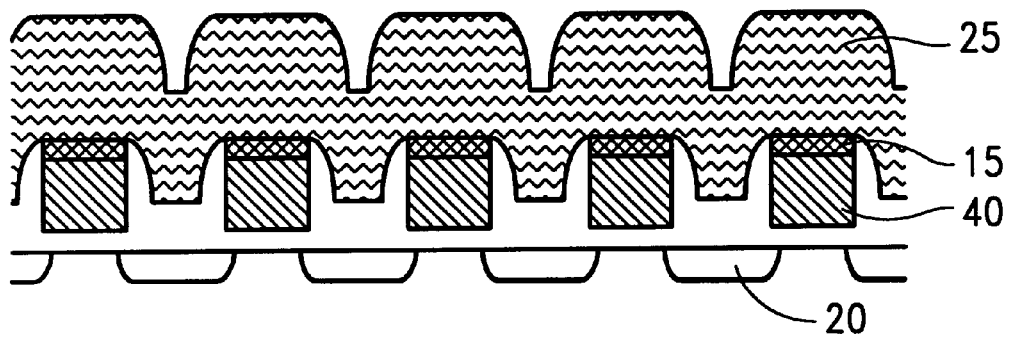
Figure 2:
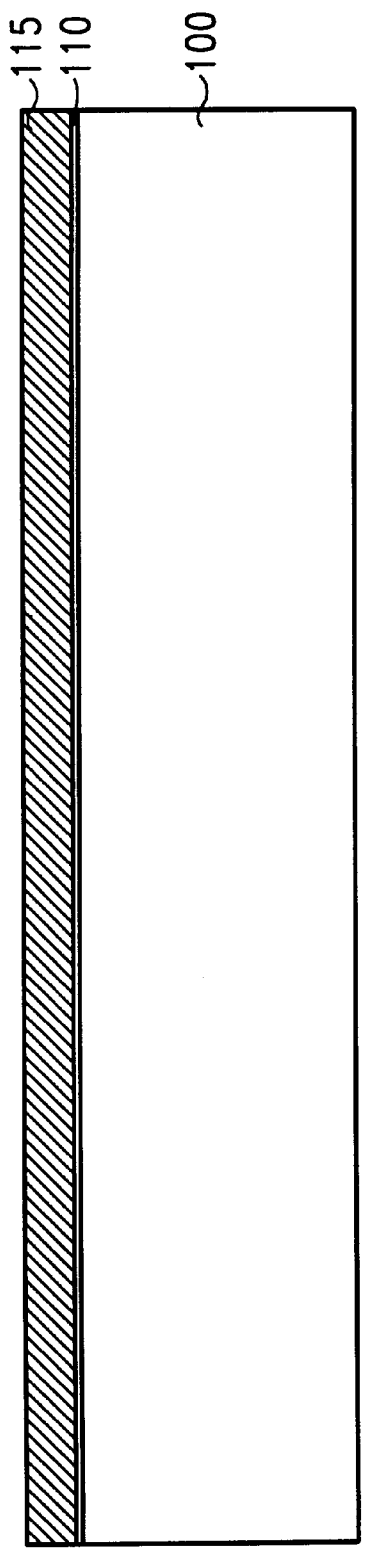
FIG. 2. is a cross-sectional view of forming a conductive impurity doped polysilicon layer on the pad oxide layer, in accordance with the present invention.

Referring to FIG. 2, an ultra-thin pad oxide layer 110 is formed using a CVD method or thermal grown method on a silicon substrate 100. The pad oxide 110 thickness is about 2–20 nm. Then a high concentration conductive impurity doped polysilicon layer 115 is deposited on the pad oxide 110. In a preferred embodiment, the doped polysilicon layer 115 is formed by an in-situ doped LPCVD process at a temperature of about 400–620° C. to about 10–100 nm in thickness. The doping method can also be achieved by another method such as a pocl doped or by ion implant. In a pocl process, a phosphorus contains liquid ($POCl_3$) is utilized as a source, the vapor from the liquid sources react with oxygen to form dopant oxides on the polysilicon layer, The equation is as follows:

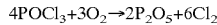

$$4POCl_3 + 3O_2 \rightarrow 2P_2O_5 + 6Cl_2$$

Figure 3:
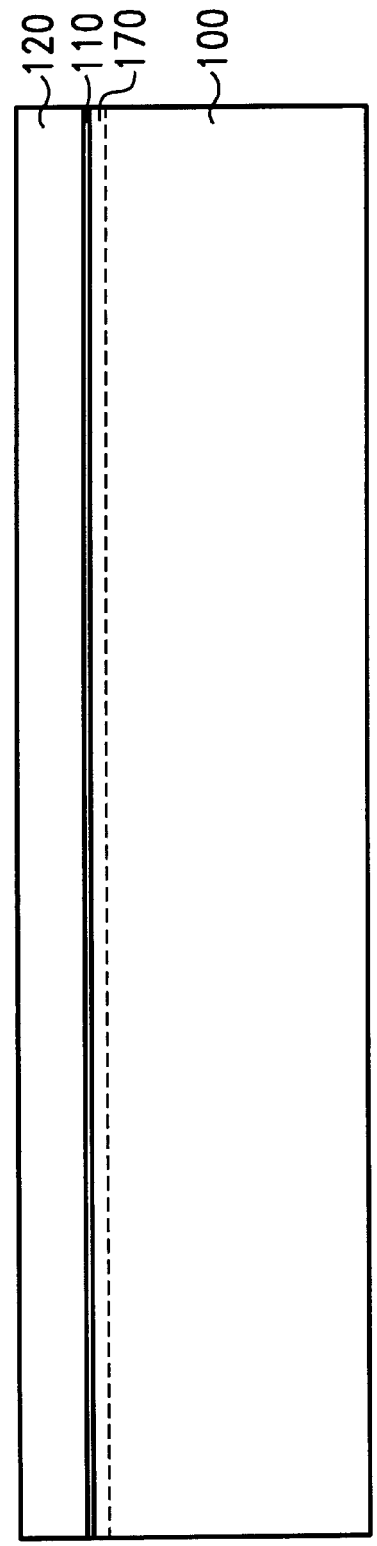
FIG. 3. is a cross-sectional view of an oxide layer and a conductive layer formed, respectively, on and beneath the pad oxide layer after a oxidation process is implemented, in accordance with the present invention.

Preferably, the doping concentration is about $5 \times 10^{19}$–$5 \times 10^{21}/cm^3$, and the thickness of polysilicon layer 115 is about 10–100 nm. After that, as shown in FIG. 3, a high temperature thermal-oxidation process is performed at temperatures of about 700–1150° C. to oxidize the polysilicon layer 115. As a result, an oxide layer 120 is formed, in the meantime the conductive impurities are driven through the pad oxide layer 110 into the underlying silicon substrate 100 to form a thin conductive layer 170.

Figure 4:
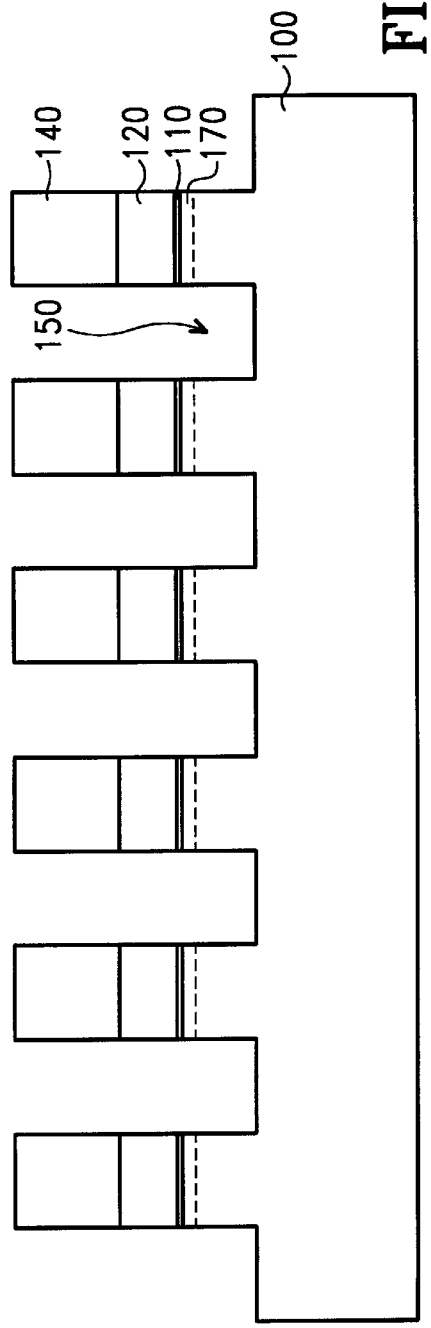
FIG. 4. is a cross-sectional view of patterning the oxide layer and the pad oxide layer into the silicon substrate to define a plurality of floating regions, in accordance with the present invention.

As shown in FIG. 4, a patterned photoresist 140 is masked on the oxide layer 120 to define the floating gate regions, and then etching steps are performed. A dry etching using $CHF_4$, $CH_3CHF_2$, $CCl_4$ and $C_3F_8$ as etchants or reactive-ion-etching chemistries to remove successively the, oxide layer 120, pad oxide layer 110, conductive layer 170 and to slightly recess the silicon substrate 100 to form a plurality of shallow trenches 150 for suppressing the short channel effect. Alternatively, $CF_4/O_2$, $SF_6$, $CHF_3$ may be used as an etchant to etching oxide layer 120 firstly, followed by the application of bromine-based chemistries consisting of $CF_3Br$ and $HBr/NF_3$ to recess the silicon in an anisotropic way.

The resulting recessed silicon trenches have a depth of about 50–600 nm. Reference may be had to the paper by P. H. Bricout et al. titled "Short-Channel Effect Immunity and Current Capability of Sub-0.1-Micron MOSFET's Using a Recessed Channel", IEEE Trans. Electron Devices, ED-43, p. 1251, 1996. In this paper, a comparison of suppressing short channel effect between the planar MOSFET and the recessed channel MOSFET was investigated using both drift-diffusion and Monte Carlo simulation. The threshold voltage roll-off (e.g., threshold voltage roll-off increases the off current level and power dissipation) is clearly presented for the planar device, however, the recessed structure nearly keeps the same threshold voltage for all simulated channel lengths and for any gate oxide thickness. In addition, for the device shorter than 50 nm, only a slow increase of the threshold swing is obtained in the recessed MOSFET's device.

Figure 5:
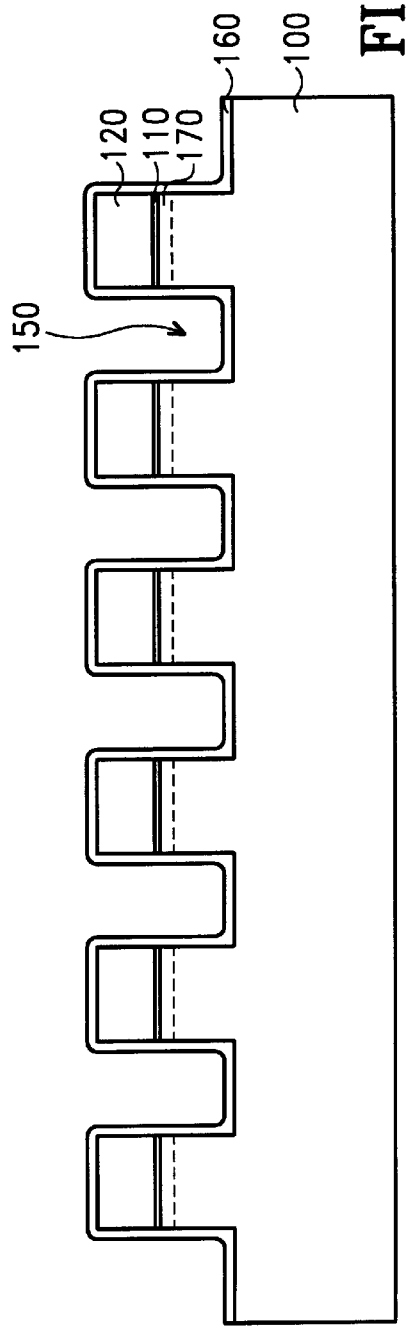
FIG. 5. is a cross-sectional view of forming a gate oxide layer, in accordance with the present invention.

Referring to FIG. 5, an ultra-thin conformal gate dielectric layer 160 deposited on all surfaces is carried out to about 3–20 nm in thickness. The ultra-thin conformal gate dielectric layer 160 is a nitride layer 160, which can be prepared by a low pressure CVD (LPCVD) or ajet vapor deposition (JVD). Preferably, the ultra-thin nitride layer is made at room temperature by JVD and then a post-thermal anneal at 800° C. in $N_2$ ambient. The ultra-thin JVD nitride serves as gate dielectric has been shown to exhibit excellent electrical properties, for instance, the transistor exhibits competitive transconductance and drivability against conventional MOSFETs. Optionally, a thermal oxidation in $N_2O/O_2$ ambient is followed to oxidize the nitride layer so as to form an oxynitride layer 160. The oxynitride 160 can be used to recover the etching damage. This was reported in the reference by S. Y. Ueng et al. titled "Superior Damage-Immunity of Thin Oxides Thermally Grown on Reactive-Ion-Etched Silicon Surface in $N_2O$ Ambient", IEEE Trans. Electro Devices, ED-41, p. 850, 1994. The $N_2O$-grown oxides can remedy the RIE-induced defects, and exhibit significantly stronger immunity to RIE-induced damage. In addition, the MOS capacitor (MOSC) with oxynitride as a gate dielectric layer shows a great improvement over those of MOSC with pure oxygen ambient grown dielectric in the leakage currents and breakage fields.

Figure 6A:
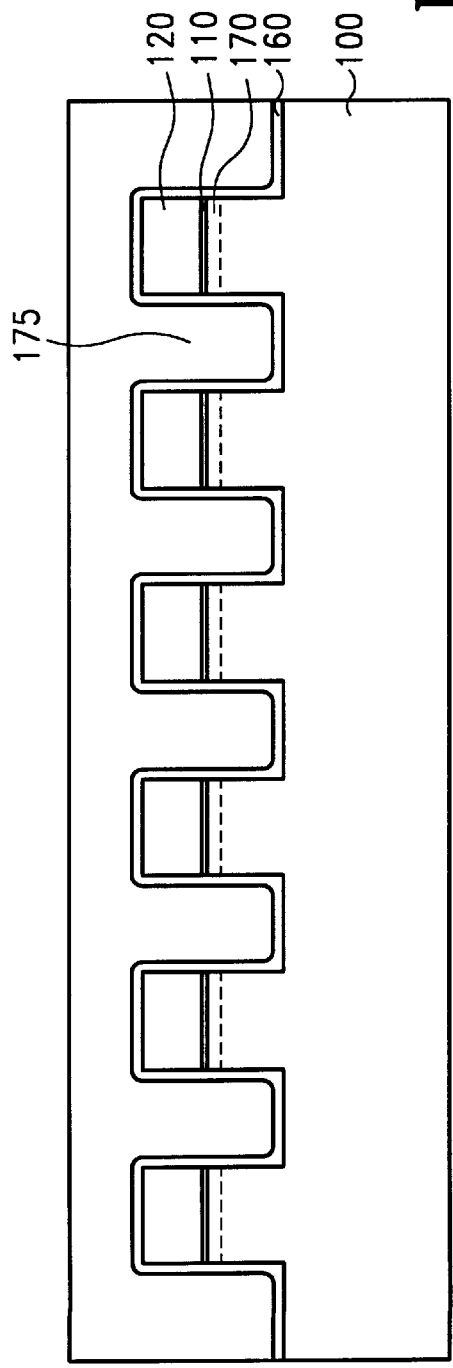
FIG. 6. is a cross-sectional view of refilling all trenches with n+ doped polysilicon or $\alpha$-Si (FIG. 6a), and then performing a planarization process by a CMP process (FIG. 6b), in accordance with the present invention.
Figure 6B:
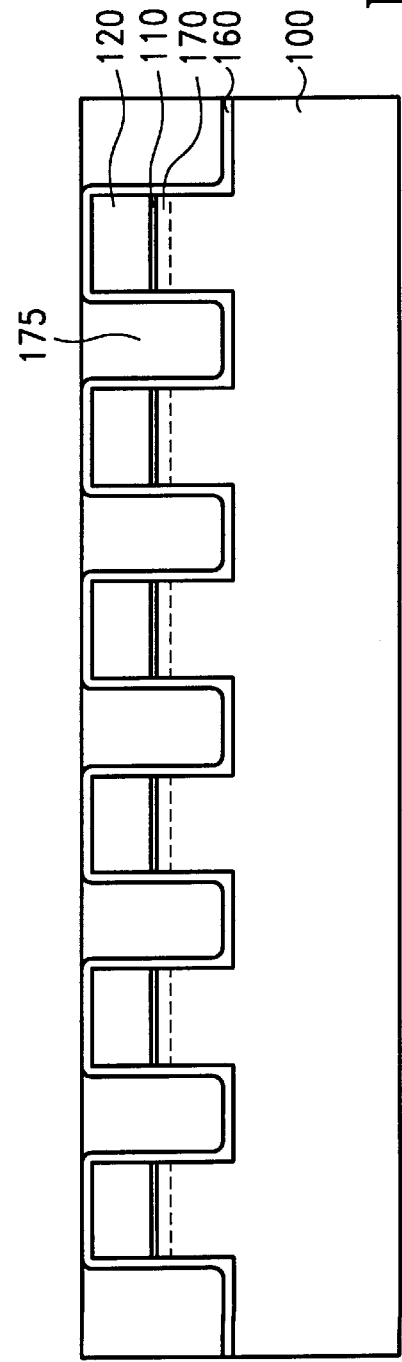

Turning to FIG. 6a, an in-situ n-type conductive impurity (n+ doped) doped polysilicon layer or a doped amorphous silicon (α-Si) layer 175 is deposited to refill the shallow trenches 150. To deposit the α-Si layer 175, the method such as a LPCVD or a PECVD can be used (operating at temperature about 400–550° C. or 250–400° C., respectively). However, to deposit the polysilicon layer 175, a higher temperature process (operating at temperatures of about 580–650°C.) such as a LPCVD is required. Which kind of silicon layer types being selected relies on the trench width (for example, to refill the trench for 0.1–0.2 μm width, α-Si is prefer, but for 0.25 μm or above, the material can be poly-Si or α-Si). In a preferred embodiment, in-situ phosphorus doped or arsenic doped Si is preferred, and the concentration is come up to about $5 \times 10^{19}$–$5 \times 10^{21}/cm^3$. Thereafter, as shown in FIG. 6b, a planarization process such as a chemical/mechanical polish (CMP) process using the gate dielectric layer 160 as a CMP stopping layer is achieved to form a flat surface. The n+ doped polysilicon layer 175 is served as a floating gate of the flash memory.

Figure 7:
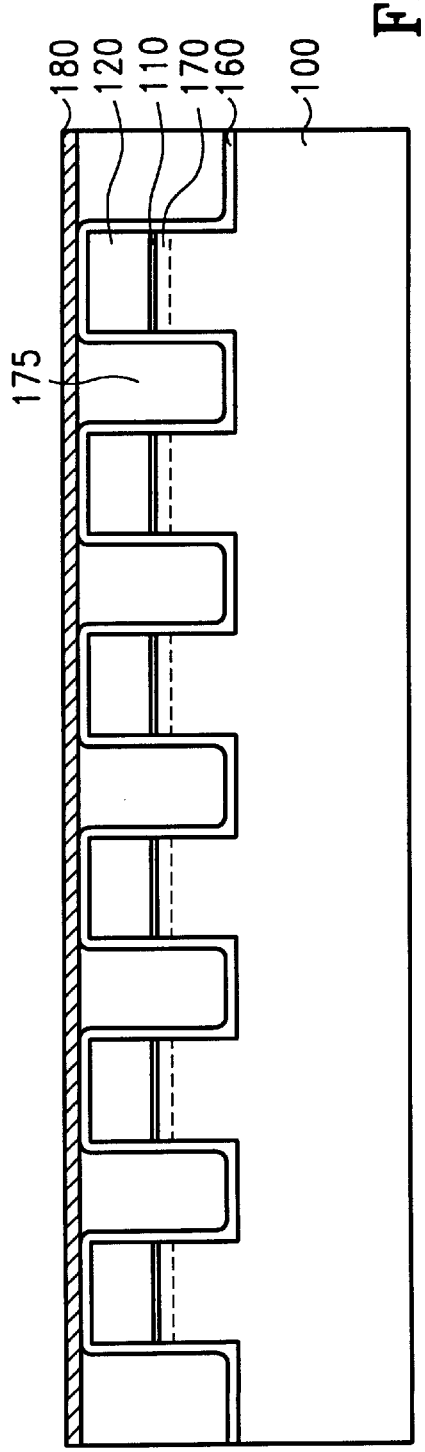
FIG. 7. is a cross-sectional view of forming a thin stacked ONO layer as an interpoly dielectric layer, in accordance with the present invention.

Referring to FIG. 7, after the CMP process, a thin stacked ONO 180 is formed as the interpoly dielectric 180. Preferably, the "ONO" layer refers the nitride layer formed using LPCVD on a thermal oxidation firstly, and then re-oxidation again to grow an oxide layer. The ONO layer having the properties of extremely dielectric integrity and long life time in breakdown characteristics. The thickness of upper oxide/nitride/ lower oxide of ONO 180 is, respectively, about 1–5 nm, 4–20 nm, and 1–5 nm.

Figure 8:
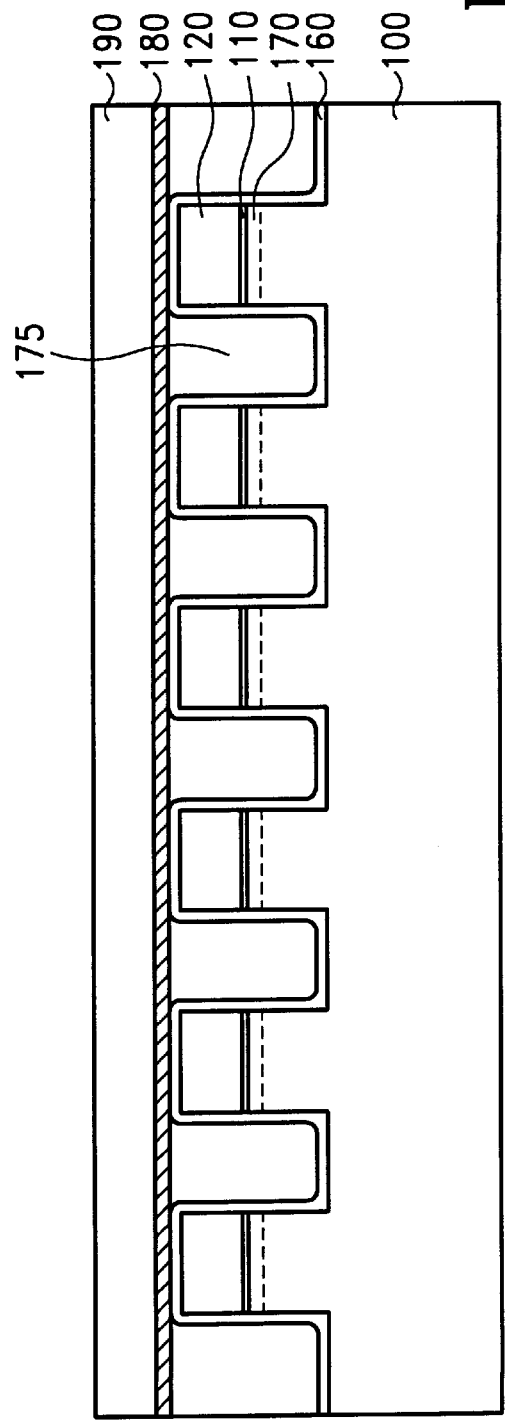
FIG. 8. is a cross-sectional view of depositing second n+ polysilicon as word lines, in accordance with present invention.

Next, referring to FIG. 8, another n+ polysilicon layer 190 is deposited on all areas, and patterned to defined word lines. In a preferred embodiment, a CVD method, such as LPCVD is performed at a temperature of about 450–650°C., and the doping concentration is about $5 \times 10^{19}$–$5 \times 10^{21}/cm^3$.

Figure 9:
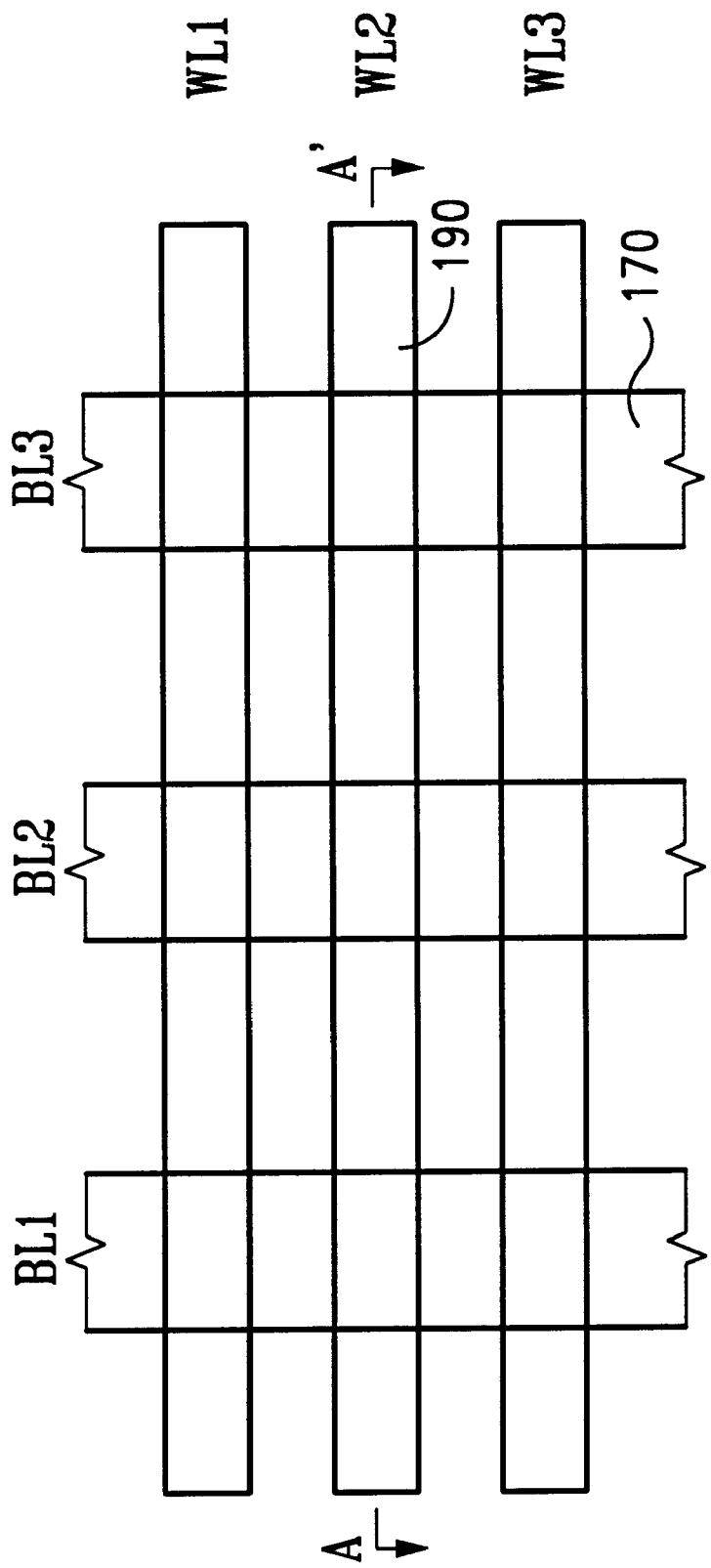
FIG. 9. is a top view of high density contactless flash memory with buried bit lines and shallow trench floating gates, in accordance with the present invention.

FIG. 9 is a top-view diagram illustrating the high-density contactless nonvolatile memory with buried bit line and floating gate in the silicon trench region, wherein the source/drain regions are bit lines 170, and the polysilicon gate 190 are word lines. The view along the word line A–A', gives the cross-section of flash memories, as depicted in FIGS. 2–8.

In conclusion, the benefits of this invention are:

(1) High density and low power non-volatile memories can be achieved (due to a cell structure with contactless array);

(2) the short channel effect can be suppressed due to the recessed silicon gate structure; and (3) the punchthrough issue between two narrow adjacent bit lines can be minimized.

As is understood by a person skilled in the art, the foregoing preferred embodiment of the present invention is an illustration of the present invention rather than being a limitation thereon. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A method of fabricating buried bit line flash EEPROM with a trench floating gate, comprising the steps of:

forming a pad oxide layer on a silicon substrate;

forming a first polysilicon layer with conductivity type impurities on said pad oxide layer;

oxidizing said first polysilicon layer so as to form an oxide layer on said pad oxide and driving said conductivity type impurities through said pad oxide layer so as to form a conductive silicon layer with said conductivity type impurities therein, which is beneath said pad oxide layer;

coating a patterned mask on said oxide layer to define a plurality of buried bit line regions;

forming a plurality of trenches come down into said silicon substrate using said patterned mask as a mask and defined said buried bit lines by utilizing said conductive silicon layer;

removing said patterned mask;

forming a gate dielectric layer on said plurality of trenches and form forming a silicon layer to refill said plurality of trenches;

performing a planarization process to a resultant surface to form a plain surface using said gate dielectric layer as an etching stopping layer;

forming an interpoly dielectric layer on a resultant surfaces; and forming a polysilicon layer on said interpoly dielectric layer to define word lines.

2. The method of claim 1, wherein said step of forming a first polysilicon layer with conductive impurities is formed at a temperature of about a temperature of about 400 to 620° C. to about . . . a thickness of about 10–100 nm.

3. The method of claim 1, wherein said first polysilicon layer is formed by a method selected from the group consisting of a in-situ doped CVD process, CVD process followed by a pocl doped process, and a CVD process followed by ion implant.

4. The method of claim 1, wherein said steps of oxidizing said polysilicon is implemented at a temperature of about 400–620° C.

5. The method of claim 1, wherein said gate dielectric layer is a nitride layer with a thickness of about 2–30 nm formed by selecting a measure consisting from the group consisting of a CVD process and a LPCVD process.

6. The method of claim 5, after forming said nitride layer further comprising an oxidation process so as to transformed said nitride layer to an oxynitride layer, said oxidation process is done at a temperature about 800–1150° C. in an ambient $N_2O/NO$.

7. The method of claim 6, wherein said step of recessing said oxide layer, pad oxide layer and silicon layer is performed by a dry etching method.

8. The method of claim 7, wherein said of plurality trenches are with depths of about 50–600 nm each, which is measured from the upper surface of said silicon substrate to the bottom of each said trench.

9. The method of claim 1, wherein said silicon layer comprises amorphous silicon and polysilicon layer, and contains n-type dopants to concentrations of about $5\times10^{19}$–$5\times10^{21}$/cm$^3$.

10. The method of claim 1, wherein said steps of forming silicon layer is done at a temperature of about 450–650° C.

11. The method of claim 1, wherein said step of performing a planarization process is done by a method comprising a CMP process.

12. The method of claim 1, wherein said interpoly dielectric layer is a stacked ONO layer, said ONO is with a second oxide layer over a nitride layer/first oxide layer to about 1–5 nm, 4–20 nm, and 1–5 nm, respectively.

13. The method of claim 1, wherein said step of forming polysilicon layer is performed by a LPCVD method at a temperature of about 450–650° C., and with n-type doping concentrations of about $5\times10^{19}$–$5\times10^{21}$/cm$^3$.

14. The method of claim 1, wherein said conductive type impurities are selected from the group consisting of arsenic containing dopants and phosphorus containing dopants.

* * * * *